United States Patent [19]
Sovero

[11] Patent Number: 5,378,922
[45] Date of Patent: Jan. 3, 1995

[54] HBT WITH SEMICONDUCTOR BALLASTING

[75] Inventor: Emilio A. Sovero, Thousand Oaks, Calif.

[73] Assignee: Rockwell International Corporation, Seal Beach, Calif.

[21] Appl. No.: 954,228

[22] Filed: Sep. 30, 1992

[51] Int. Cl.⁶ .................. H01L 29/161; H01L 29/72
[52] U.S. Cl. ........................... 257/582; 257/197; 257/198; 257/200
[58] Field of Search ............ 257/197, 198, 582, 200, 257/201

[56] References Cited

U.S. PATENT DOCUMENTS

| | | |
|---|---|---|
| 3,893,154 | 7/1975 | Mroczek et al. ............... 257/582 |
| 3,936,863 | 2/1976 | Olmstead ....................... 257/582 |
| 4,266,236 | 5/1981 | Ueda .............................. 257/582 |
| 4,706,378 | 11/1987 | Havemann ...................... 257/582 |
| 4,794,440 | 12/1988 | Capasso et al. ................ 257/198 |
| 4,979,009 | 12/1990 | Kusano et al. ................. 257/198 |
| 5,001,534 | 3/1991 | Lunardi et al. ................ 257/197 |
| 5,036,372 | 7/1991 | Ohishi et al. .................. 257/198 |
| 5,063,426 | 11/1991 | Chandrasekhar et al. ..... 257/197 |

FOREIGN PATENT DOCUMENTS

| | | | |
|---|---|---|---|
| 0127064 | 10/1980 | Japan ............ | 257/582 |
| 0065267 | 3/1990 | Japan ............ | 257/582 |
| 0131038 | 6/1991 | Japan ............ | 257/582 |

*Primary Examiner*—Rolf Hille
*Assistant Examiner*—David Ostrowski
*Attorney, Agent, or Firm*—John C. McFarren

[57] ABSTRACT

A III-V semiconductor device is provided with a ballasting resistor that may be connected in series with the emitter, collector, or base of an HBT, depending on the function of the device. The semiconductor ballasting resistor is formed in the subcollector epitaxial layer that is in intimate thermal contact with the substrate. The resistor is defined by isolating a rectangular area of the subcollector with ohmic contacts at each end and is fabricated with no processing steps in addition to those required for the HBT. The resistor provides self-limiting current capacity because of its semiconductor nature. Connected in series with the HBT emitter, the semiconductor resistor prevents destruction of the HBT, particularly in multiple cell, high power applications.

12 Claims, 1 Drawing Sheet

HBT WITH SEMICONDUCTOR BALLASTING

TECHNICAL FIELD

The present invention relates to high power heterojunction bipolar transistors (HBTs) and, in particular, to an HBT having semiconductor current ballasting.

BACKGROUND OF THE INVENTION

Gallium arsenide (GaAs) semiconductor devices have important applications for generating power in the high RF and microwave regions of the electromagnetic spectrum. GaAs heterojunction bipolar transistors (I-IBTs), in particular, have characteristics that make them especially suitable for power generation.

The power rating of an HBT (i.e., its current carrying capability) is directly proportional to the active surface area of the device. Because an HBT is a vertical device, its active area is determined by the surface area of the emitter. Depending on its design, a typical HBT unit cell has an active area of approximately 20 to 60 $\mu m^2$. An HBT of this size is able to handle about 1 milliwatt of RF power per square $\mu m$ of active area. Therefore, about 0.06 watts is typically the most power that can be generated by a single HBT cell. Attempts to increase the power much beyond this limit usually produce catastrophic failures.

To be useful as power devices, HBTs must be able to generate power on the order of watts rather than milliwatts. Such high power output levels are generated by increasing the effective area of the device. However, it is impractical to increase the active area of an HBT unit cell because current crowding (hot spots of high current) and detrimental heating effects negate any gain obtained by the increased area. The generally accepted alternative, which works well for small and medium devices generating less than about 0.25 watts, is to connect many HBT unit cells in parallel to increase the effective area.

With larger devices, a different form of current crowding, termed "thermal runaway," begins destroying the HBT cells. Thermal runaway occurs because the parallel devices are not all identical and do not have identical heat sinks. When one HBT cell gets slightly hotter than its neighboring cells, it begins to carry more current, which makes it hotter, so it carries more current, which makes it hotter, etc. This unstable condition rapidly leads to destruction of the entire device. As each unit cell is blown open, the remaining cells have to carry more current, which makes them hotter and more likely to be destroyed. A generally accepted method of controlling the thermal runaway problem is using thin film ballasting resistors with each cell to force uniform current distribution. It is also possible to grow an additional epitaxial layer on top of the HBT emitter layer to act as a ballasting element. Additional fabrication steps are required with all of these prior methods, however, and it is difficult to meet material requirements. Thus, there is a need for a new type of HBT ballasting that does not require additional epitaxial layers or fabrication processing steps.

SUMMARY OF THE INVENTION

The present invention comprises a III-V compound HBT device having a semiconductor ballasting resistor that may be connected in series with the emitter, the collector, or the base, depending on the function of the device. The resistor is formed in the sub-collector, an epitaxial semiconductor layer that is in intimate thermal contact with the substrate. The resistor is defined by isolating a rectangular area of the subcollector with ohmic contacts at each end. The value of the resistor is a function of the length, width, and resistance per square unit of the subcollector semiconductor material forming the resistor. The semiconductor resistor can be formed during fabrication of the HBT without additional processing steps.

A principal object of the invention is to provide ballasting for HBTs, particularly in high power applications. A feature of the invention is a self-limiting semiconductor ballasting resistor connected to an HBT. An advantage of the invention is an HBT ballasting resistor that is fabricated in intimate thermal contact with the substrate without requiring additional processing steps.

BRIEF DESCRIPTION OF THE DRAWINGS

For a more complete understanding of the present invention and for further advantages thereof, the following Detailed Description of the Preferred Embodiment makes reference to the accompanying Drawings, wherein the same or similar elements are identified with the same reference characters throughout the several Figures, in which.

DETAILED DESCRIPTION OF THE PREFERRED EMBODIMENT

The present invention comprises a III-V semiconductor device having a semiconductor ballasting resistor connected to a heterojunction bipolar transistor (HBT). The HBT includes an emitter, a collector, and a base, and is fabricated using known processing methods. The HBT may comprise a p-n-p transistor or an n-p-n transistor. The semiconductor ballasting resistor is formed in a subcollector layer deposited atop a substrate during fabrication of the HBT. Depending on the function of the device, the ballasting resistor may be connected to the emitter, the collector, or the base of the HBT.

In an important embodiment of the present invention, as described below in conjunction with FIGS. 1-4, the semiconductor resistor is connected in series with the HBT emitter to serve a current limiting, circuit protecting function. This embodiment is especially useful in protecting a plurality of HBT cells that are connected in parallel to form a high power circuit. Although the semiconductor ballasting resistor is connected to the HBT emitter in the preferred embodiment described below, connecting the semiconductor resistor to the collector or base of the HBT to form a device with a different function is well within the capability of one having ordinary skill in the art.

Figure 1:
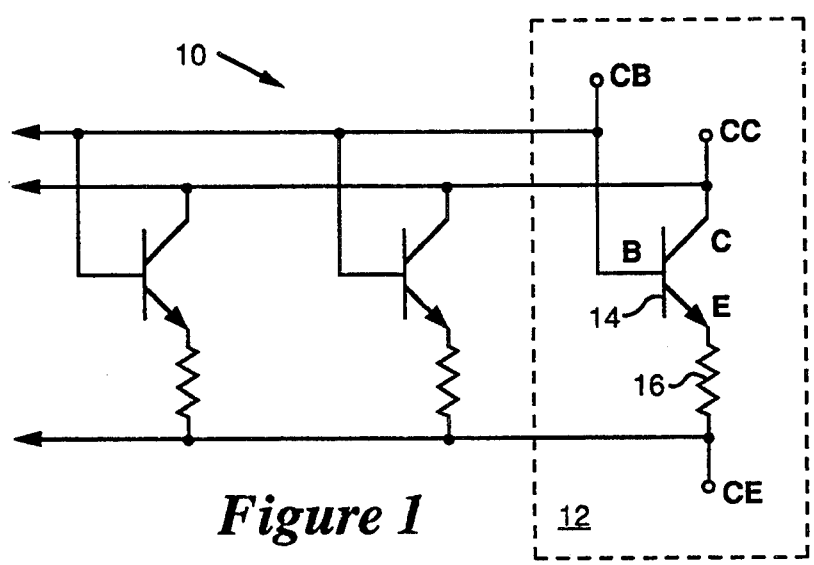
FIG. 1 is a schematic circuit diagram of a plurality of transistor cells connected in parallel, each cell including a ballasting resistor connected in series with the emitter of the transistor.

FIG. 1 is a schematic diagram illustrating the electrical circuit of the preferred embodiment of the present invention. In the high power device 10 of FIG. 1, a plurality of transistor cells, such as cell 12 indicated by a dashed line box, are connected in parallel. Transistor cell 12 includes a bipolar transistor 14 and a ballast resistor 16. Transistor 14 includes a collector C, a base B, and an emitter E. Resistor 16 is connected in series with emitter E to provide a current limiting, circuit protecting function for transistor 14. The collector and base of each of the plurality of transistors of device 10 are connected in parallel to a common collector CC and a common base CB, respectively. The ballast resistors 16 are likewise connected to a common emitter CE, as illustrated. This use of ballasting resistors 16 forces uniform current distribution through the plurality of transistors 14 and prevents thermal runaway from destroying high power device 10.

Figure 2:
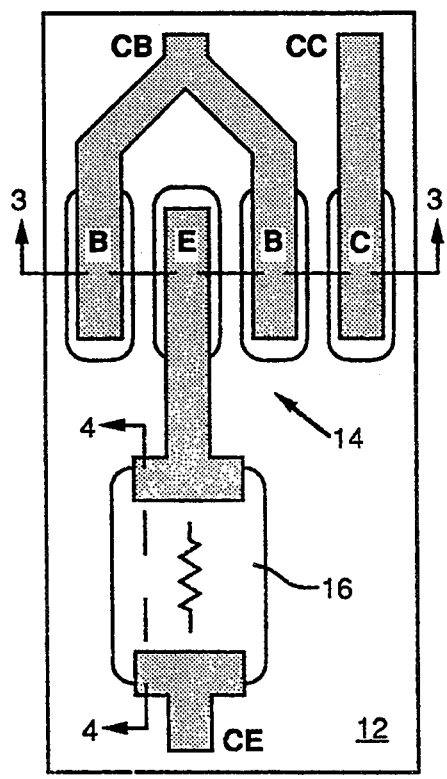
FIG. 2 is a top plan view of an embodiment of an HBT device of the present invention having a ballasting resistor connected in series with the HBT emitter.
Figure 3:
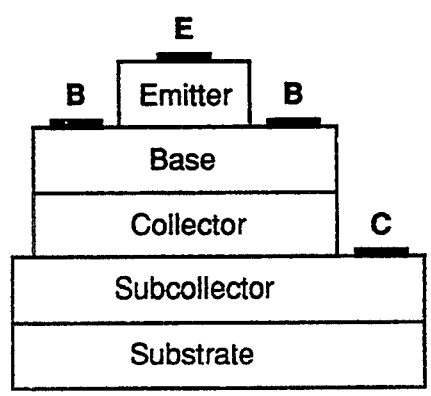
FIG. 3 is a cross sectional view of the HBT of FIG. 2 taken along the section line 3—3.
Figure 4:
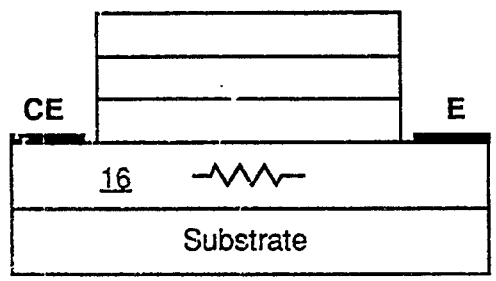
FIG. 4 is a cross sectional view of the HBT of FIG. 2 taken along the section line 4—4.

The present invention integrates ballasting resistor 16 into a III-V semiconductor device as illustrated in FIGS. 2-4. In FIG. 2, an HBT cell 12 is fabricated on a semi-insulating GaAs substrate, for example. As described above, HBT cell 12 includes an HBT 14 and a ballasting resistor 16. The epitaxial layer structure of HBT 14 is illustrated schematically in the cross sectional diagram of FIG. 3, which is taken along the section line 3—3 of FIG. 2. As shown in FIG. 3, HBT 14 includes a subcollector layer deposited on the substrate, a collector layer deposited atop the subcollector, a base layer deposited atop the collector, and an emitter layer deposited atop the base. The emitter layer may include a cap layer and a contact layer atop the cap layer as is well known in the art. Ohmic contacts E, B, and C are deposited as illustrated to form the emitter, base, and collector contacts, respectively, of HBT 14.

The fabrication of HBT 14 includes well known processing steps such as isolation, etching, deposition, and ohmic contact. Semiconductor resistor 16 is formed in the subcollector layer during the same processing steps required for HBT 14, but is isolated from HBT 14 as is well known in the art. The epitaxial layer structure of resistor 16 is illustrated schematically in the cross sectional diagram of FIG. 4, which is taken along the section line 4—4 of FIG. 2. The required size of resistor 16, such as 6 ohms for example, determines the amount of chip "real estate" needed. The dimensions of resistor 16 can be calculated from the known sheet resistivity of the subcollector layer, which may be 12 ohms per square, for example. At this sheet conductivity, a 6 ohm resistor can be made from an area 3 microns long and 6 microns wide (a ratio of 1 to 2), for example. Sufficient area (about 5 microns at each end) is reserved for depositing the ohmic contacts, which may be deposited at the same time as collector contact C and which become contacts E and CE shown in FIG. 4. Finally, appropriate ohmic interconnects are made to connect resistor 16 to emitter contact E, for example, of HBT 14, as shown in FIG. 2. The common emitter contact CE may be connected in parallel to a plurality of other HBT cells to form a high power device as illustrated in the circuit diagram of FIG. 1.

The formation of ballasting resistor 16 in the subcollector layer of HBT 14 provides several advantages over the prior art. First, fabrication of resistor 16 requires no processing steps in addition to those needed for HBT 14. Second, semiconductor resistor 16 is in intimate thermal contact with the substrate of the device, which provides a heat sink. Third, the current carrying capacity of resistor 16 is self-limiting because of its semiconductor nature. These characteristics of semiconductor resistor 16 make it ideal for current limiting protection of a multiple cell, high power HBT device, such as device 10 shown schematically in FIG. 1.

Although the present invention has been described with respect to specific embodiments thereof, various changes and modifications can be carried out by those skilled in the an without departing from the scope of the invention. Therefore, it is intended that the present invention encompass such changes and modifications as fall within the scope of the appended claims.

I claim:

1. A III-V semiconductor device, comprising:
   a substrate;
   a subcollector layer deposited atop said substrate;
   a collector layer deposited atop said subcollector layer,
   a base layer deposited atop said collector layer;
   an emitter layer deposited atop said base layer,
   said collector, base, and emitter layers forming an HBT;
   a semiconductor resistor formed in said subcollector layer; and
   an ohmic contact connecting said semiconductor resistor to said HBT.

2. The III-V semiconductor device of claim 1, wherein said semiconductor resistor comprises a predetermined area of said subcollector corresponding to a predetermined value of said resistor.

3. The III-V semiconductor device of claim 1, wherein said ohmic contact connects said semiconductor resistor in series with said emitter.

4. The III-V semiconductor device of claim 1, wherein said semiconductor resistor comprises a current ballasting resistor for said HBT.

5. A III-V semiconductor HBT, comprising:
   a semi-insulating substrate;
   the HBT formed on said substrate and having a subcollector layer deposited atop said substrate, a collector layer deposited atop said subcollector layer, a base layer deposited atop said collector layer, and an emitter layer deposited atop said base layer;
   a semiconductor resistor formed in said subcollector layer; and
   an ohmic contact connecting said semiconductor resistor to said HBT.

6. The III-V semiconductor HBT of claim 5, wherein said semiconductor resistor comprises a predetermined area of said subcollector corresponding to a predetermined value of said resistor.

7. The III-V semiconductor HBT of claim 6, wherein said ohmic contact connects said semiconductor resistor in series with said emitter.

8. The III-V semiconductor HBT of claim 7, wherein semiconductor resistor comprises a current ballasting resistor for the HBT.

9. A high power III-V semiconductor device, comprising:
   a semi-insulating substrate;
   a subcollector layer deposited atop said substrate, a collector layer deposited atop said subcollector layer, a base layer deposited atop said collector layer, and an emitter layer deposited atop said base layer;
   a plurality of HBTs formed from said deposited layers and connected in parallel;
   each of said HBTs comprising a collector, a base, and an emitter;
   a plurality of semiconductor resistors formed in said subcollector layer; and a plurality of ohmic contacts, each of said ohmic contacts connecting one of said plurality of semiconductor resistors to a corresponding one of said plurality of HBTs.

10. The high power III-V semiconductor device of claim 9, wherein each of said semiconductor resistors comprises a predetermined area of said subcollector corresponding to a predetermined value of said resistor.

11. The high power III-V semiconductor device of claim 10, wherein each of said ohmic contacts connects one of said plurality of semiconductor resistors to the emitter of a corresponding one of said plurality of HBTs.

12. The high power III-V semiconductor device of claim 11, wherein said semiconductor resistors comprise current ballasting resistors for protecting the high power semiconductor device.

* * * * *